(12) United States Patent
Bintz et al.

(10) Patent No.: US 11,095,249 B2
(45) Date of Patent: Aug. 17, 2021

(54) PHOTOVOLTAIC MANAGEMENT AND MODULE-LEVEL POWER ELECTRONICS

(71) Applicant: Enphase Energy, Inc., Petaluma, CA (US)

(72) Inventors: Miles Bintz, Round Rock, TX (US); Patrick L. Chapman, Austin, TX (US); Jonathan L. Ehlmann, Austin, TX (US); Julianne Frances Haugh, San Jose, CA (US); Dale Herman, Austin, TX (US); Brian Kuhn, Austin, TX (US); Kelly Mekechuk, Austin, TX (US); Eric Roesinger, San Jose, CA (US)

(73) Assignee: Enphase Energy, Inc., Petaluma, CA (US)

( * ) Notice: Subject to any disclaimer, the term of this patent is extended or adjusted under 35 U.S.C. 154(b) by 18 days.

(21) Appl. No.: 16/840,952

(22) Filed: Apr. 6, 2020

(65) Prior Publication Data
US 2020/0235699 A1   Jul. 23, 2020

Related U.S. Application Data

(63) Continuation of application No. 16/005,206, filed on Jun. 11, 2018, now Pat. No. 10,615,742, which is a
(Continued)

(51) Int. Cl.
*H02S 50/00* (2014.01)
*H04B 17/309* (2015.01)
(Continued)

(52) U.S. Cl.
CPC ............ *H02S 50/00* (2013.01); *G01R 21/133* (2013.01); *G08B 21/182* (2013.01); *H02J 3/00* (2013.01); *H04B 17/309* (2015.01)

(58) Field of Classification Search
CPC ..... H02S 50/00; H04B 17/309; G01R 21/133; G08B 21/182; H02J 3/00
(Continued)

(56) References Cited

U.S. PATENT DOCUMENTS

| 8,121,743 B2 | 2/2012 | Boss et al. |
| 8,134,499 B2 | 3/2012 | Wang et al. |

(Continued)

FOREIGN PATENT DOCUMENTS

| JP | 2015138864 A1 | 7/2015 |
| WO | WO-2011128875 A1 | 10/2011 |
| WO | WO-2015111473 A1 | 7/2015 |

OTHER PUBLICATIONS

International Search Report and Written Opinion for Application No. PCT/US2016/055684, dated Dec. 8, 2016.

*Primary Examiner* — Alfonso Perez Borroto
(74) *Attorney, Agent, or Firm* — Moser Taboada

(57) ABSTRACT

A photovoltaic (PV) system includes module-level power electronic (MLPE) devices that produce energy. The PV system includes a gateway to receive and send data to MLPE devices. The gateway also connects the PV system with a network, such as a local area network, that allows access to the Internet. The gateway provides functionality within the PV system to perform various processes to improve operation of MLPE devices.

20 Claims, 9 Drawing Sheets

Related U.S. Application Data continuation of application No. 14/880,143, filed on Oct. 9, 2015, now Pat. No. 10,003,300.

(51) Int. Cl.
  *G01R 21/133* (2006.01)
  *G08B 21/18* (2006.01)
  *H02J 3/00* (2006.01)

(58) Field of Classification Search
  USPC .......................................................... 307/84
  See application file for complete search history.

(56) References Cited

U.S. PATENT DOCUMENTS

| | | |
|---|---|---|
| 9,158,302 B2 | 10/2015 | Thompson |
| 9,160,408 B2 | 10/2015 | Krohne et al. |
| 9,590,559 B2 | 3/2017 | Jarnason et al. |
| 9,880,228 B2 | 1/2018 | Wank et al. |
| 2011/0066401 A1 | 3/2011 | Yang et al. |
| 2011/0133558 A1* | 6/2011 | Park ............ H02J 3/005 307/66 |
| 2012/0044014 A1* | 2/2012 | Stratakos ......... H03K 17/145 327/530 |
| 2012/0116696 A1 | 5/2012 | Wank |
| 2012/0326511 A1 | 12/2012 | Johnson |
| 2013/0015710 A1 | 1/2013 | Rotzoll et al. |
| 2013/0054037 A1* | 2/2013 | Ikawa ............ G05F 1/67 700/286 |
| 2014/0084687 A1* | 3/2014 | Dent .............. H02J 7/0068 307/26 |
| 2015/0163074 A1 | 6/2015 | Pruett et al. |
| 2016/0164295 A1* | 6/2016 | Cheng ............ H02J 3/388 307/22 |
| 2017/0264212 A1* | 9/2017 | Muguerza Olcoz .... H02M 7/44 |
| 2017/0317501 A1* | 11/2017 | Moriyama ............ H02J 3/46 |

* cited by examiner

PHOTOVOLTAIC MANAGEMENT AND MODULE-LEVEL POWER ELECTRONICS

CROSS-REFERENCE TO RELATED APPLICATIONS

The present application is a continuation application of U.S. patent application Ser. No. 16/005,206, filed on Jun. 11, 2018, which is a continuation application of U.S. patent application Ser. No. 14/880,143, filed on Oct. 9, 2015, which issued on Jun. 19, 2018 as U.S. Pat. No. 10,003,300, the entire contents of each of these applications is herein incorporated by reference.

BACKGROUND

Photovoltaic (PV) cells, commonly known as solar cells, are devices for conversion of solar radiation into electrical energy. Generally, solar radiation impinging on the surface of, and entering into, the substrate of a solar cell creates electron and hole pairs in the bulk of the substrate. The electron and hole pairs migrate to p-doped and n-doped regions in the substrate, thereby creating a voltage differential between the doped regions. The doped regions are connected to the conductive regions on the solar cell to direct an electrical current from the cell to an external circuit. When PV cells are combined in an array such as a PV module, the electrical energy collected from all of the PV cells can be combined in series and parallel arrangements to provide power with a certain voltage and current.

Photovoltaic (PV) systems can include devices to convert the direct current (DC) electricity from solar panels into alternating current (AC) electricity. This AC may be manipulated and processed such that it can be accepted by a public power grid, used locally by an operator of the PV systems, and transmitted for offsite use. The manipulation and processing of the voltage from the PV system for subsequent use can be carried out under supervised conditions, controlled operations, and with the use of software and hardware management implementations. These management implementations may control and/or monitor the PV system or its operation.

DETAILED DESCRIPTION

Figure 1:
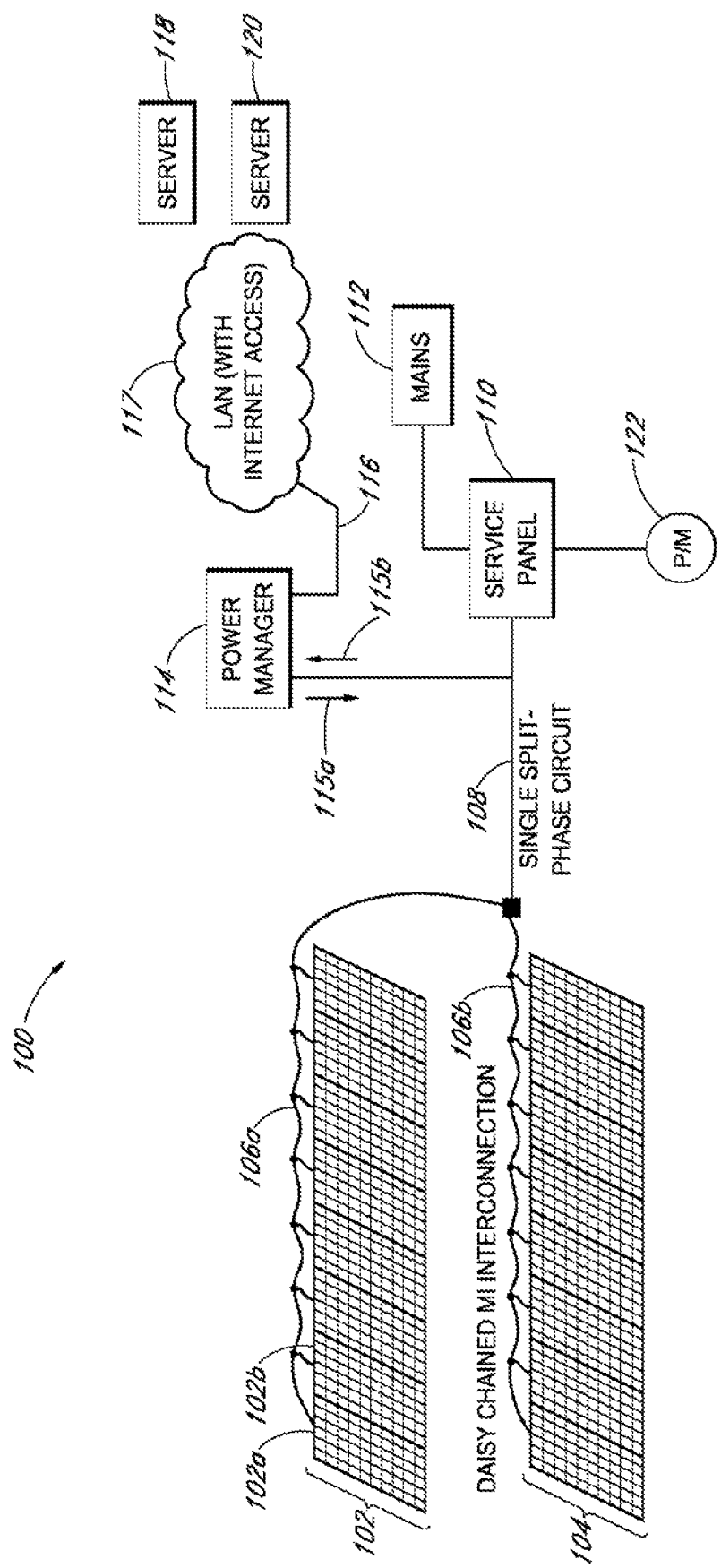
FIG. 1 illustrates a photovoltaic (PV) system, including gateway, according to some embodiments.

The following detailed description is merely illustrative in nature and is not intended to limit the embodiments of the subject matter of the application or uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment," "a disclosed embodiment," "an embodiment" or "some embodiments." The appearances of the phrases "in one embodiment" "in a disclosed embodiment," "in an embodiment" or "some embodiments" do not necessarily refer to the same embodiment. Particular features, structures, or characteristics may be combined in any suitable manner consistent with this disclosure.

Terminology. The following paragraphs provide definitions and/or context for terms found in this disclosure (including the appended claims):

"Comprising." This term is open-ended. As used in the appended claims, this term does not foreclose additional structure or steps. "Configured To." Various units or components may be described or claimed as "configured to" perform a task or tasks. In such contexts, "configured to" is used to connote structure by indicating that the units/components include structure that performs those task or tasks during operation. As such, the unit/component can be said to be configured to perform the task even when the specified unit/component is not currently operational (e.g., is not on/active). Reciting that a unit/circuit/component is "configured to" perform one or more tasks is expressly intended not to invoke 35 U.S.C. § 112, sixth paragraph, for that unit/component.

"First," "Second," etc. As used herein, these terms are used as labels for nouns that they precede, and do not imply any type of ordering (e.g., spatial, temporal, logical, etc.). For example, reference to a "first" solar cell does not necessarily imply that this solar cell is the first solar cell in a sequence; instead the term "first" is used to differentiate this solar cell from another solar cell (e.g., a "second" solar cell). Likewise, the term "at least one" includes one or more than one.

"Based On." As used herein, this term is used to describe one or more factors that affect a determination. This term does not foreclose additional factors that may affect a determination. That is, a determination may be solely based on those factors or based, at least in part, on those factors. Consider the phrase "determine A based on B." While B may be a factor that affects the determination of A, such a phrase does not foreclose the determination of A from also being based on C. In other instances, A may be determined based solely on B.

"Coupled"—The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

"Inhibit"—As used herein, inhibit is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, and/or effect which might otherwise occur. Accordingly, when a component, element, or feature is referred to as inhibiting a result or state, it need not completely prevent or eliminate the result or state.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

In the following description, numerous specific details are set forth, such as specific operations, in order to provide a thorough understanding of embodiments of the present disclosure. It will be apparent to one skilled in the art that embodiments of the present disclosure may be practiced without these specific details. In other instances, well-known techniques are not described in detail in order to not unnecessarily obscure embodiments of the present disclosure.

Embodiments can include photovoltaic (PV) systems with module-level power electronics (MLPE) devices that can offer the capability to monitor module-level data such as voltage, current and the temperature of a given PV module. Such systems, with MLPE devices, may include systems with microinverters, alternating current photovoltaic (ACPV) modules, or dc-dc optimizers. In embodiments these or other components may be used in a PV module to convert the direct current (DC) electricity from the solar panels into alternating current (AC) electricity. In embodiments, some MLPE devices may also couple to a gateway device, or communications unit, or gateway functionality such that MLPE data can be aggregated and analyzed for performance, reliability, customer service and the like. This and other data may be accessed locally at the site of the PV system or via a network, such as the Internet. Data from more than one module, or even numerous modules, may also be generated in systems of MLPE devices. Site data and module-to-module comparison data may also be available, gathered, analyzed, and acted upon in embodiments. Gateway devices, systems, and methods may provide this functionality and additional functionality, such as, for example, logging and time-stamping data as it is received or is otherwise available to it and modifying their operation based on monitored events. Embodiments may also include, in addition to having the MLPE monitor messages, analyze data, and then send alerts, an MLPE modifying its own operation based on these monitored messages.

Embodiments may include gateways and gateway functionality that may be referred to as a power manager, and may be a separate device within a PV system, apart from the MLPE devices, however, the gateway and its functionality may also be incorporated into MLPE devices or other components of the PV system or across components of the PV system. Preferably, a gateway, whether a specific device or functionality provided by several devices, can communicate over a network, such as the Internet as well communicate locally to and within the PV system, including the microinverters or other associated electronics at the MLPE devices. This communication functionality may allow a gateway to execute techniques, processes, methods, and the like to improve performance or add functions to a PV system for which it is a part of or for another PV system in which the gateway is not a part of. These functions may include those discussed herein.

For example, gateway embodiments may test networking protocols and transports by requesting a command response from a random "target" so that the signal quality of the transport layer, preferably a physical layer, may be determined. The gateways may perform these tests without addressing a test message to a specific unit and may instead use timing and the absence of the presence of a response to gauge the viability of a network protocol or network transport. This technique may be helpful in overcoming protocols or transport layers that are unable to respond to commands unless a message is addressed to a specific unit, or some "discovery" process is performed. This technique may also be helpful in the case of performing a discovery where the parameters used to perform the discovery may result in excessive time delays in order to avoid collisions between discovered objects.

Embodiments may also assist in situations employing an array of ACPV modules or other MLPE-based modules, where communication via a gateway may occur over a noisy media, or transport, such as power lines. In these situations, during a discovery process, embodiments may serve to accommodate noise that may increase the time taken to discover modules that may not be known previously to exist in the PV system.

Also, according to some embodiments, reception of a well-formed packet may not be as important as receiving a signal that is representative of the "health" of the communications medium. Here, only a responsive signal to a test may be desired so embodiments may not rely on properly formed response packets in order to perform its testing. In order to overcome violations of the proper timing parameters for a global discovery command, embodiments may employ specify time parameters that insure collisions within the allotted listening time. Embodiments may also transmit a discovery poll command with insufficient time delays to listen for and receive the response. For broadcast discovery schemes, embodiments may also employ time parameters that have been selected to balance between response collisions and time. In so doing, embodiments may provide for violations of the transport or network timing requirements and may promote message responses that contain a significant number of errors because of collisions on the media. These collisions may not be problematic in embodiments as the signal itself can be what is sought for receipt or logging or measurement rather than the quality of the actual response.

Embodiments may also provide for discovery or management by a gateway without using a broadcast discovery method. Thus, in addition to or instead of a minimum time delay, a turn-around delay or other delay may also be used for receiving an inquiry query response. A discovery scheme according to some embodiments may involve transmitting a very short message, waiting a maximal timeout period for a response, noting the response of one is found, incrementing the address, and repeating the process until the address space is exhausted or a maximum address value is reached.

Embodiments can accommodate, for example, scanning the range of available addresses from beginning to end, and wait for a response as well as protocol imposed delays during this process. For example, in a network operating at a default baud rate of 19.2 kb/s, with a total of 11 bits per byte, wherein a single byte may need 572 μs. The shortest common message that requires a response may be one of a "read a single xyz" type responses. The command query packet may have a length of 6 bytes, and the response packet may also have a length of 6 bytes as well. Including a 3.5 T imposed delay, or other value, the start of a response may not happen faster than one every 9.5 character times, or approximately once every 6 ms. If there is no "wait for response" timeout, the step of scanning all 255 possible addresses according to this example may be not less than 1.5 s. In other embodiments, interpacket and turnaround delays may also be inserted and total delays of 100 to 150 ms may not be uncommon. The delays may increase the scan time for a complete address range from 1.5 s to 25 or more seconds.

Thus, according to some embodiments, network protocol may be violated by starting the next message while a gateway system was supposed to be listening for a response. According to these embodiments, there should be one of two possible outcomes. One outcome may be that the device will respond in the usual response time, such as 3.5 T plus processing delays; and another outcome may be no response. By selecting a response that is longer than the time it takes the master to transmit the message, a gateway system should be able to detect the response after the end of the next message, or during that command message's 3.5 T period. Because the gateway knows when it is talking, it is able to distinguish between its own signaling on the physically connected bus and that of a responding servant. Thus, the responses are interleaved for faster overall traversing of the list.

In other embodiments, the PV system, including the gateway arrangement, may maintain an estimate of the amount of power that may be produced if the utility is willing to accept all available power from the renewable energy PV system. This estimate may be done through the use of environmental sensors, such as pyranometers, historical data, recently reported data, an estimate based on time of day and array geometry, and the like. The estimate may be used with a system that is presently generating power, but also may be self-limited. The estimate also may be used with a system that presently is disconnected from the electric utility grid.

Applications of embodiments may further include mitigation services and functionality for partial shading scenarios. For example, in embodiments a first MLPE search voltage to determine if there is another higher global MPP (Maximum Power Point) caused by partial shading and if so determined the first MLPE can operate at this new MPP and transmit its power and voltage. During this same time or subsequent to it, a second MLPE may monitor the first MLPE's power and voltage and can trigger its own search for a new MPP to accommodate partial shading scenarios affecting the second MLPE.

In a similar dual monitoring scenario, MLPE A and B may be microinverters on the same system, e.g., a 3-phase system where MLPE A senses L1 and L2 voltage; MLPE B senses L2 and L3 voltage. When MLPE A reports L1 and L2 voltage, MLPE B monitors this report and if the L1 voltage is out of range, MLPE B determines without sensing L1 voltage and is able to react by ceasing to energize the grid. Thus, embodiments may also provide for self-monitoring applications where the actual parameters being monitored are of related MLPEs and not the MLPE conducting the self-monitoring activities or carrying out any system adjustments on itself or others based on the monitoring.

The disclosed embodiments may facilitate peaking operations where a system is presently producing power, but in a reduced capacity, as per a maximum power output restriction on an associated facility. The disclosed embodiments also may facilitate some form of gateway black start services where a system is not producing power due to the power grid being down or inoperative. A possible advantage of using distributed renewable energy resources is that they may synchronize to the power grid immediately, such as spinning reserves.

In addition to any decision to either reconnect to the electric grid, or to exceed the maximum power output restrictions put in place through some form of agreement with a receiving grid or protocol, the disclosed embodiments may provide the ability to alter any pre-set windows for either voltage or frequency. The system may be better able to ride through fluctuations in the grid without disconnecting automatically according to some embodiments.

Data for such systems may be provided by an individual system, or through some gateway aggregation means. This data also may include additional information needed by the ISO or utility to perform operations, such as meter identifications, customer numbers, device addresses in some form of network addressing scheme, or other information as needed to effect the change in renewable system behavior.

Some equipment may desire access to alternating current (AC) power in order to report system information. In this instance, the disclosed embodiments may include requesting some form of periodic authorization to produce power, or to produce power in excess of a contractual time limit. Thus, the system may query those components that are otherwise inaccessible.

In some embodiments, the following process may be implemented. A gateway arrangement may monitor actual power from the PV system. This power may be an aggregation of power from a number of MLPE units. The gateway arrangement may estimate the amount of power that the PV system could be producing and calculates the difference with the amount actually being produced. The gateway arrangement may report this spare capacity to a portal or other service, such as may be maintained by an electric utility. Based on the feedback from the portal or utility, the PV system may temporarily increase its power. The PV system also may potentially override previously imposed regulatory limits. This feature may aid the utility in establishing grid stability or restarting the grid from a blackout.

In some embodiments, remote monitoring of PV systems via a gateway may be provided. Electric utilities may use comparable home power consumption and residential home installed PV system size, orientation, and the like to determine if a residential PV system is functioning properly. They may do so by examining the exported power production of the residence relative to how much the home is expected to produce and consume. These embodiments may be relevant where a production meter is absent The disclosed embodiments may implement a gateway process to monitor a PV system for potential problems. A gateway arrangement can aggregate PV power and consumption via an electric meter (household, commercial and the like) and the gateway arrangement may report these values to a portal or other service, such as a utility vendor.

For example, disclosed embodiments may execute processes at the portal or utility to search for anomalies in the user's total electricity consumption. A fault signal or other flag may be produced and reported to the user if the consumption falls outside of normal bounds. The signal or flag may indicate that the PV system needs service. Thus, in embodiments, a PV system may fall within some range of expected outputs, which also is true for consumption. Values falling outside this range may trigger an alert on a customer's bill to service their PV system. Further, the utility or monitoring service may be alerted of a possible problem exists. Such an alert may trigger a service call or other remediation measures.

In some embodiments, a gateway process may remotely enable or disable a PV system. For example, a PV system customer has failed to make a lease payment, and, by contract, the vendor may shut down power from the PV system until payments are brought within approved pay periods. Other reasons also may drive shutting down power from the PV system, such that the disclosed embodiments allow the utility vendor to turn off the devices producing power.

A gateway arrangement may provide periodically a secure, or heartbeat, signal to the MLPE devices to keep operating. In the absence of the signal, the MLPE devices of the PV system may stop producing power. For example, every time the lease is paid, a new code is sent indicating that the system is a "go" to operate. One issue with these embodiments may be the security therein, which is important because the leased system, or any system based on power purchase agreements, produce no revenue if the payment is not made.

The gateway arrangement may have encryption to enable or disable in the form of a one-time pad cipher. A state machine may establish the proper loading of the one-time pad. Once the pad is put in place, it may be changed with a new one. The new pad message may contain at least a number of keys sufficient to cover a minimum time period, such as the lease payment term. The pad, for example, may contain 32 56-bit digital encryption standard (DES) keys, and 32-bit pad identifier, and a 32-bit previous pad identifier. The pad may be encrypted using 3-DES prior to being transmitted to the gateway. The pad may be decrypted using 3-DES by the MLPE devices when it is installed.

The gateway arrangement can receive the pad as a text-encoded information portion, and then package it into a power line communication (PLC) message. An MLPE device can verify that the previous pad identifier is correct prior to installing the pad. Factory programming may set the previous pad identifier to a pre-defined value associated with an MLPE device's 3-DES key. The gateway arrangement can receive the response message, and then confirm the response. Once the handshake is completed, the pad may be installed with the key in index 0 becoming active.

During acknowledgement of a poll cycle of the gateway sampling data from each MLPE device, in turn, the disclosed embodiments may respond with a plain-text information portion containing two random 32-bit numbers, encrypted with the then-active key in the pad. These numbers may be randomly selected according to the following relationship:

$R1now > R1prev;$ and $R2now < R2prev.$

An MLPE device may decrypts the message, verify the relationship, and note the numbers for future use. If the verification fails, then an MLPE device may raise an alert and enter a verification mode.

Each key may be valid for a certain number of poll cycles. For example, the disclosed embodiments can keep each key valid for 128 poll cycles, with each poll cycles having a timer. Once a key has been used for 128 refresh timers, disclosed in greater detail below, a "go to the next key" command may be received or an MLPE device can into verification mode.

The "go to the next key" command does not indicate the key to use. Instead, it may recite "go to the next key" as a request to an MLPE device. The request to "go to the next key" may be issued by a system vendor at the start of the monitoring day. As with the command to set the pad, the command requires a confirmation of the response. The response from an MLPE device may be the pad identifier, rotated by twice the value of the new index, and encrypted using the MLPE 3-DES key.

The system vendor may receive this message, decrypt it with 3-DES. It may verify that an MLPE is on the correct key in the pad. The transitions may ensure that the "go to the next key" does not result in the system going into a dead mode. A bogus response may indicate that something is wrong. A good response may result in the system vendor sending the MLPE devices an acknowledgement that the key was handled correctly.

The following is an example of the remote enable or disable process according to some embodiments. The MLPE device can check in every so often, such as every 15 minutes. Other time periods may also be used and correspond with system objectives. The MLPE device may do this a specified number of times, such as 120-130 time periods, or poll cycles, at 10-20 minutes each. More particularly, the MLPE device may check in about 128 poll cycles at 15 minutes each and an AC restart may count as a "check in," regardless of length. When the MLPE device is in verification mode, the verification mode alert may be returned. The alert may be cleared by one of a variety of messages from the gateway, such as "refresh," "go to the next key," or "have some new keys" messages. If the keypad provided to the MLPE device is exhausted, then it may respond with a "down" alert and continues the 128 "check ins." Once in this state, it may be excited by receiving a specified "valid" message, such as "have some new keys." Once the MLPE device exceeds its allocated number of "check ins" in the "down" mode, it may refuse to make power and enter a "dead" mode. This state, again, may be exited with a specified "valid" message, such as "have some new keys." According to the above examples, the allocated number of "check ins" may be about 128.

The disclosed embodiments also may implement a "shutdown" command from a gateway arrangement to an MLPE device. This command may request that the MLPE device, or its microinverter, go to the end of the pad and enter into "dead" mode with no "check ins" remaining. This state may be excited by receiving a specified "valid" message, such as "have some new keys." This command may bypass the process disclosed by the example above.

Thus, in some embodiments, protection for remote enabling and disabling of the PV system are provided. Important keys, such as the 3-DES ones, may not be used very often, so standard DES attacks may prove difficult because not enough information is available. In some embodiments, the 3-DES keys may be used once a month. This feature may result in a small number of potentially-known plaintexts. If the original "pad identifier" is cracked, then it becomes a known plaintext for a known plaintext attack. The weaker keys, such as the single DES ones, may not be used more than 128, or some other number, of times.

In embodiments, the "refresh" message may be part cryptography and part pitfall trap. The R1 and R2 values may have a relationship, as noted above. A utility vendor may be able to send a message with the correct relationship. An attacker, however, who decides to eventually send messages, may run out of room if they are randomly successful. Each successful spoof reduces the odds of the next one being successful because there are fewer and fewer valid random values remaining. Spoofing this message may be practical at any time other than immediately after a new key is enabled, and that statistically it is the same as not spoofing the message at all. The message of the disclosed embodiments also may prevent replay attacks because R1(now) may be greater than R1(prev), while R2(now) may be greater R2(prev).

The disclosed embodiments for the remote enable or disable process may apply to a start-up sequence. In embodiments, an MLPE device may start-up in verification mode and assert the corresponding alert. This action may consume a "check in" count. The alert may be pushed to the utility manager, which then may send a "go to next key" message. In so doing, both the MLPE device and the utility vendor know when the end of the pad has been reached, which may result in the sending of a new pad. A countdown timer may be set for each "refresh" that is successful. In some embodiments, this period may be about 20 minutes. If the timer expires, then a "check in" is consumed and the timer set for another period of time. In some embodiments, this period may be 15 minutes.

Sometimes, in embodiments, there may be many restarts of the PV system, or associated MLPE devices. The utility may reduce the stride for each R1 and R2 value so that all 128 poll cycles of the DES key may be used. In these, plus the operations disclosed above, the 3-DES keys are preferred. Other key formats, however, may be used, such as the advanced encryption standard (AES). The feature of having the "new pad" message include the "old pad" identifier results in that an attacker may not just install his/her own pad. This allows validation of a 3-DES key, and means the key is less likely to be cracked. If the key is cracked, then the MLPE device may run for another 128 poll cycles. Though the lessee of the solar power equipment may get free power, it may only be for the time period of the allotted poll cycles. This way is preferred over disabling power accidently to paying customers. Even under a denial of service attack, one may repeatedly request that the MLPE device advance to the next key, and then pretend that the response was decoded properly. Eventually, however, one would exhaust the keys in the pad and then receive a shutdown command.

Thus, according to some embodiments, a customer may determine that he/she can go offline and disconnect the PV system. The inverters within the PV system may keep producing power despite being offline. The inverters should preferably keep producing power for a period of time while waiting for the new "lease" key timers.

Embodiments may utilize a permanent shutdown mode if commanded or if a suitable number of leases expire without a refresh operation. A specific encrypted sequence may be required to bring the PV system back online. A shutdown command may be implemented when there are no more keys and no more "check in" operations allowed. To recover from a shutdown state, the MLPE device may be sent a message that includes the encrypted "previous pad identifier." If a properly encrypted "previous pad identifier" is not received, then the MLPE device is not unlocked, and remains shutdown. Using this approach, the utility may be able to prevent unauthorized use of leased PV systems.

In some embodiments, a process to enable module-to-module monitoring may be used. As disclosed above, some monitoring processes may include the gateway polling each unit and receiving a response. The gateway may aggregate the data and report this information to a service, such as a web portal, where the information may be analyzed.

Because MLPE devices often share the same communication channel, they may be able to listen to each other's messages. For example, MLPE device A may produce 200 watts (W) while device B may produce 27 W. If device A monitors on the power status message, then it may compare its own production and signal to the gateway that something may be wrong. In this example, the disparity between power outputs invokes an alert. Further, if the voltage of a nearby module is substantially different, then this condition may indicate a different type of abnormality.

Thus, each MLPE device is another machine on the network that may continuously analyze the traffic for interesting information. If this MLPE device is programmed with important product data, such as the make or model of the PV module, or the expected operating parameters for the PV module (voltage or current ranges), then it may compare information from other modules to its own. This comparison may detect an abnormality in a shorter time than using the gateway to conduct the analysis. In some embodiments, the gateway may not be needed, and not installed. In these instances, the MLPE devices may monitor each other effectively.

With all the disclosed embodiments, the methods and processes utilize the feature of the communication with a given MLPE device may represent information from the MLPE device itself, or another MLPE device within the array from which information has been detected.

FIG. 1 depicts a photovoltaic (PV) system 100 having a gateway 114 to generate power according to embodiments. PV system 100 includes module-level power electronics, or MLPE, devices to generate power from PV modules and supply this power for use. The MLPE devices allow for the capability to monitor module-level data such as the voltage, current and temperature of a given PV module.

For example, as shown in FIG. 1, PV system 100 shows a set of PV modules 102 and a set of PV modules 104. Additional sets of PV modules may be included in PV system 100, and two sets are shown for clarity. Each set includes a number of PV modules. This number may vary and is not fixed according to the disclosed embodiments. Each PV module includes PV cells. The PV cells may collect solar energy to generate power. In FIG. 1, PV modules 102a 102B are shown for reference purposes. When referring to "PV module 102a" or "PV module 102b" in the disclosure below, this reference includes any PV module within any PV module set.

PV modules 102 and 104 also include converters connected to the PV cells to convert the collected energy into useable power. The converters may be microinverters, ACPV modules, dc-ac converters, dc-dc optimizers, and the like. PV system 100 may implement daisy chained interconnections between the sets of PV modules to collect the power. As shown in FIG. 1, interconnection 106a may be coupled to PV modules 102 and interconnection 106b may be coupled to PV modules 104. Other interconnections may be used for other sets of PV modules.

Power collected by interconnections 106a and 106b is provided to single split-phase circuit 108 to deliver the power to a main power line 112. A service panel 110 may be coupled between single split-phase circuit 108 and main power line 112. Service panel 110 may be on location with PV modules 102 and 104, and allow for maintenance, repair, adjustment and the like of components within PV system 100. A functional electric meter 122 also may be coupled to PV system 100. Gateway device 114, or gateway arrangement, also is arranged with single split-phase circuit 108 to monitor data and information coming from PV modules 102 and 104. Gateway 114 is disclosed in greater detail by FIG. 8.

As noted above, PV modules 102 and 104 along with their associated converters, microinverters and the like may be referred to as MLPEs. Gateway 114 may aggregate data from these components and analyze the data for performance, reliability, customer service, and the like, to monitor or improve the performance of PV system 100. Gateway 114 may collect site data and module-to-module comparison data in performing these functions. Data or messages received by gateway 114 may be shown by 115*a*, while transmitted messages or data may be shown by 115*b*. Gateway 114 also may log timestamp data. In some embodiments, gateway 114 may be referred to as a power manager and may be resident in a single device or across multiple devices as both circuit and/or software adaptations.

The data collected by gateway 114 may be accessed locally at PV system 100 or via the Internet. Thus, in some embodiments, gateway 114 is coupled to a local area network (LAN) connection 116 to access a LAN 117. LAN connection 116 may be a wired connection, or, alternatively, a wireless connection that uses appropriate protocols to communicate with LAN 117. Using LAN connection 116 and LAN 117, gateway 114 may send data to destinations not physically located with PV system 100. In some embodiments, gateway 114 may send collected data on PV system 100 to servers 118 and 120. In a sense, gateway 114 connects the PV modules and other MLPE devices to the Internet. Additional servers and other components having internet protocol (IP) addresses may be included, but not shown for clarity.

Gateway 114 may perform various functions, disclosed in greater detail below. Alternatively, gateway 114 may send the data to another device, such as server 118 or 120, to perform functions for PV system 100. Gateway 114 then may facilitate the performance of the functions based on the analysis of the devices outside PV system 100.

Several functions and processes are disclosed below that may be advantageously deployed in gateway 114. Implementation in gateway 114 may be preferred as it saves steps and time in communicating with PV modules 102 and 104, or other MLPEs, within PV system 100. Communication may not be required with devices, such as servers 118 and 120, not located in the vicinity of PV system 100. Gateway 114 may address any issues or performance problems within PV system 100 directly.

Gateway 114 may include a processor to execute instructions. Gateway 114 also may include a memory to store the instructions. In some embodiments, the memory may be a read-only memory (ROM) or a random access memory (RAM). Gateway 114 also includes one or more input/output ports to receive and transmit data to the MLPE devices within PV system 100 and to the network. In some embodiments, gateway 114 acts as a computer.

Figure 2:
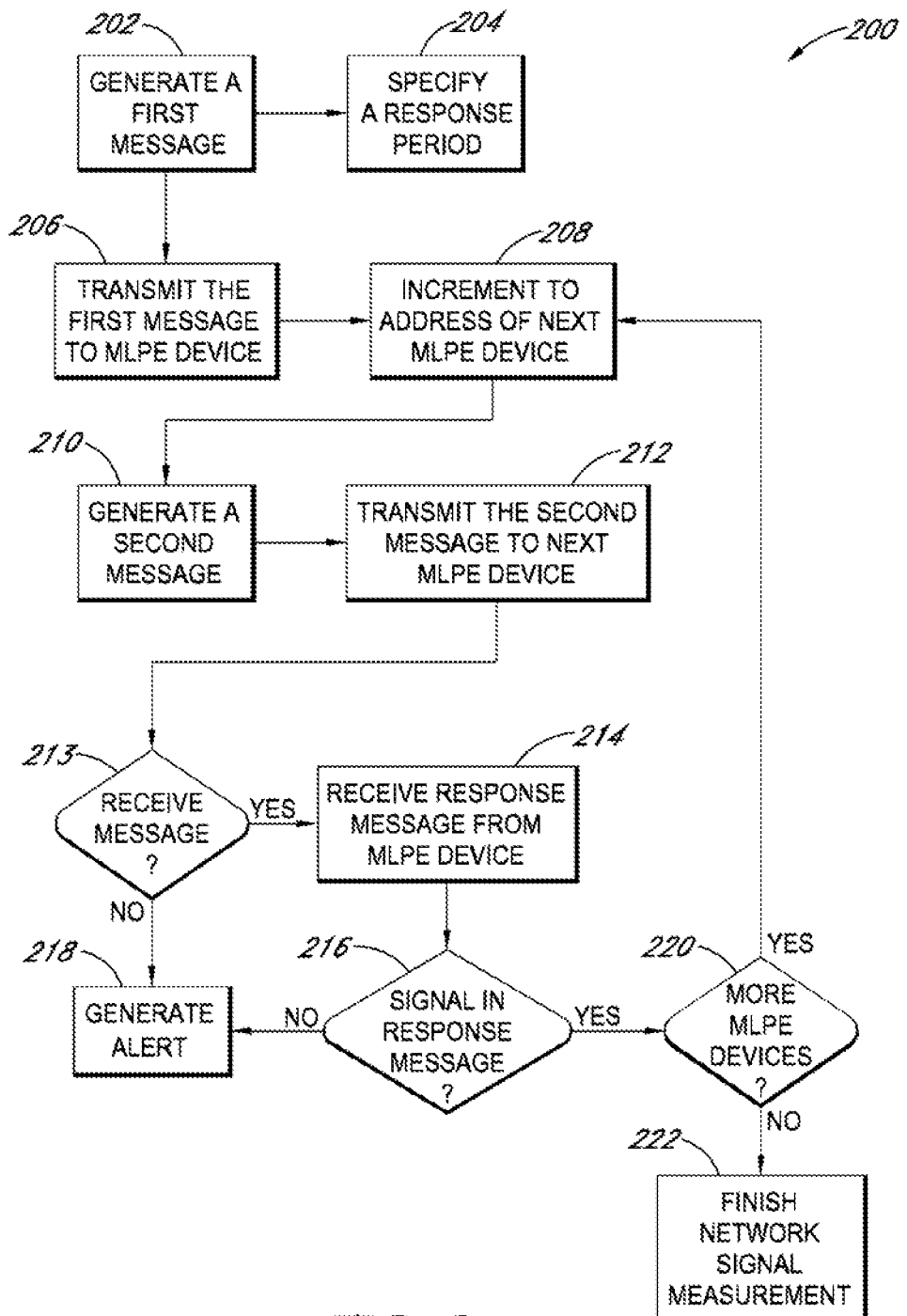
FIG. 2 illustrates a flowchart for network signal measurement using gateway functionality according to some embodiments.

According to some embodiments, network signal measurement may be performed by gateway 114. FIG. 2 depicts a flowchart 200 for network signal measurement using gateway 114. PV system 100 may implement a protocol or transport that uses a response to a command message to a specific MLPE device, so that some discovery process is performed. These communications may occur over a noisy medium (transport layer), such as power lines. Referring back to FIG. 1, gateway 114 may communicate with PV modules 102 and 104 via circuit 108 and interconnections 106*a* and 106*b* using these components as bus. If there is noise within these components, then the time to "discover" PV modules within sets 102 and 104 may be increased.

In some embodiments, as noted above, it is not important to receive a well-formed packet as a response. All that may be needed is a signal. The signal may be used to determine the "health" of a MLPE device, such as PV module 102*a* or 102*b*, within PV system 100. If a signal is not returned or detected, then gateway 114 may indicate that a problem has occurred during network signal measurement. The time frame for doing this process, however, may be timely, as disclosed above. Thus, gateway 114, according to the disclosed embodiments, may violate the system protocol for proper timing parameters for a global discovery command in performing network signal measurement. Violation of the timing requirements may result in message responses that contain a number of errors caused by collisions on interconnections 106*a* and 106*b*, or circuit 108. The disclosed embodiments, however, are not concerned with the actual response, but whether a signal is present.

Thus, step 202 executes by generating a first message at gateway 114. This first message preferably is a command message to a MLPE device within PV system 100. For example, the first message may be a command message to PV module 102*a*. Step 204 executes by specifying a response period for the first message, and all subsequent messages sent by gateway. The response period may refer to the period to receive a response message in reply to a command message.

This period may relate to protocols for messaging within PV system 100. For example, a protocol may specify a waiting period, or time delay, for a response to a command message sent within PV system 100. Other delays may be associated with this time period, such as delays for processing and overhead. According to some embodiments, the response period may be longer than the time needed to transmit another message, as disclosed below. Step 204 may occur at any time and is not dependent upon step 202. The flow shown in flowchart 200 is for convenience purposes only.

Step 206 executes by transmitting the first message to an MLPE device within PV system 100 from gateway 114 at a time 1. The first message may be sent to an address within PV system 100 for the MLPE device. Step 208 executes by incrementing to the next address for another MLPE device within PV system 100. Gateway 114 may be provided a set of addresses for MLPE devices, such as the PV modules and associated microinverters, within PV system 100. For example, each MLPE device may have a unique address. Gateway 114 may move through the set of addresses while sending messages in performing the disclosed network signal measurement process.

Step 210 executes by generating a second message to the next MLPE device. As disclosed above, the second message may be a command message. Step 212 executes by transmitting the second message to the next MLPE device from gateway 114 at a time 2. Preferably, gateway 114 sends the second message to the address for the next MLPE device. Time 2 may refer to a point in time that is started in violation of a communication protocol used by the MLPE and is transmitted during a period of time when a message sender should be listening for a response to the first message.

Step 213 executes by determining whether a response message to the sent first message was received within the specified response period. The response period preferably is longer than the time it takes to generate and transmit the second message at time 2. Thus, gateway 114 should be able to detect the response message to the first message after the transmission of the second message, during the specified delay period. Gateway 114 may be configured and operable to distinguish between its own signaling on the bus and signaling from an MLPE device responding to the first or second message, even if this action may violate network protocols for PV system 100.

If step 213 is no, then flowchart 200 moves to step 218, disclosed below. If step 213 is yes, then step 214 executes by receiving the response message for the first message from the MLPE device at gateway 114. Step 216 executes by determining whether a signal is within the response message. As disclosed above, gateway 114 may just identify a signal within the response packet and not the actual response.

If step 216 is no, then step 218 is executed by generating an alert. The alert, preferably, is from gateway 114 to a user or a utility. The alert may be sent via LAN 117. The alert may indicate the impacted MLPE device, identified by its address. Alternatively, the alert may indicate there is a problem with PV system 100.

If step 216 is yes, then step 220 is executed by determining whether another MLPE device should be checked within PV system 100. As noted above, a list of addresses for the MLPE devices may be provided. Gateway 114 may proceed through this list, or set, of addresses to determine the status of the different devices. If step 220 is yes, then flowchart 200 returns to step 208 to continue generating and receiving messages for signal measurement. If step 220 is no, then step 222 is executed by finishing the network signal measurement.

According to the embodiments shown by FIG. 2, the response messages may be interleaved for faster overall traversing of the list of addresses for the MLPE devices. Network protocols for messaging may be violated to enact the interleaving. By using gateway 114, the disclosed embodiments may perform network signal measurement for the status of PV system 100 in a timely manner without resorting to use of components outside the system.

Another function that may be implemented using gateway 114 is a black start service. A black start service may occur after PV system 100 has been shut down due to a disruption or other problem. The PV modules of sets 102 and 104 may be turned off during this shutdown. The process of bringing PV system 100 back online may depend on having balanced power and load. The black start service provides this feature by making sure that components of PV system 100 come-back online in a certain way at a certain time.

In some systems, a restart after a shutdown may occur if the power grid looks acceptable for a period of time, such as five (5) minutes. Using a black start service, a utility may communicate with gateway 114 to begin this process sooner.

Figure 3:
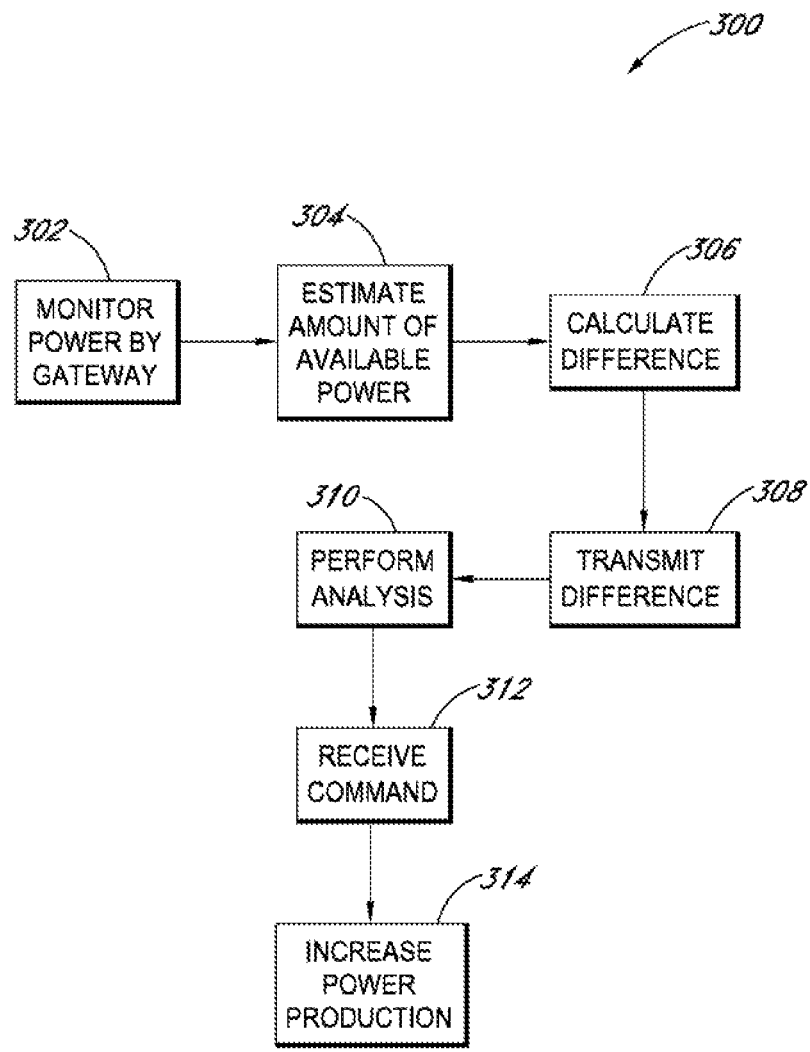
FIG. 3 illustrates a flowchart for a black start service on a PV system according to some embodiments.

FIG. 3 illustrates a flowchart 300 for a black start service on PV system 100 according to some embodiments. Step 302 executes by monitoring the actual power from PV system 100 by gateway 114. The actual power may be an aggregation of power from a number of MLPE devices. For example, referring back to FIG. 1, gateway 114 may monitor the actual power from PV modules 102 and 104, or each set individually.

Step 304 executes by estimating the amount of power that PV system 100 could be producing. Step 306 executes by calculating the difference between the estimated amount of power and an actual amount of power being produced by PV system 100. In some embodiments, gateway 114 performs the estimation and calculation operations.

Step 308 executes by transmitting the calculated difference from gateway 114 to a third-party. Gateway 114 reports the spare capacity for PV system 100. In some embodiments, the third-party may be a utility, a portal or other service. Step 310 executes by performing an analysis, or series of analyses, based upon the calculated difference between the estimated amount of power available in PV system 100 and the actual amount of power being produced. A computing device, such as server 118, may perform any analysis.

Step 312 executes by receiving a command from the third-party. This command may occur during blackout conditions, or when there is a disruption of power being produced by PV system 100. The command may be based on the analysis of the difference provided to the third-party. Step 314 executes by increasing power production within PV system 100 according to the difference. Thus, PV system 100 may increase its power production, even if temporarily. PV system 100 may implement this increase even if it potentially overrides previously imposed regulatory limits. This action would potentially aid the third-party in establishing grid stability or restarting the grid during the blackout condition.

According to some embodiments, remote monitoring of PV system 100 also may occur. The remote monitoring may be used to determine if a PV system is functioning properly by examining the exported power production relative to how much the PV system is expected to be producing. The consumption of power by a load also may be important. In some embodiments, the load may be a household, residential or commercial power system. As this data is logged, patterns may emerge over time for power production and consumption. Weather patterns, for example, may be determined by the logged data over a period of time.

Figure 4:
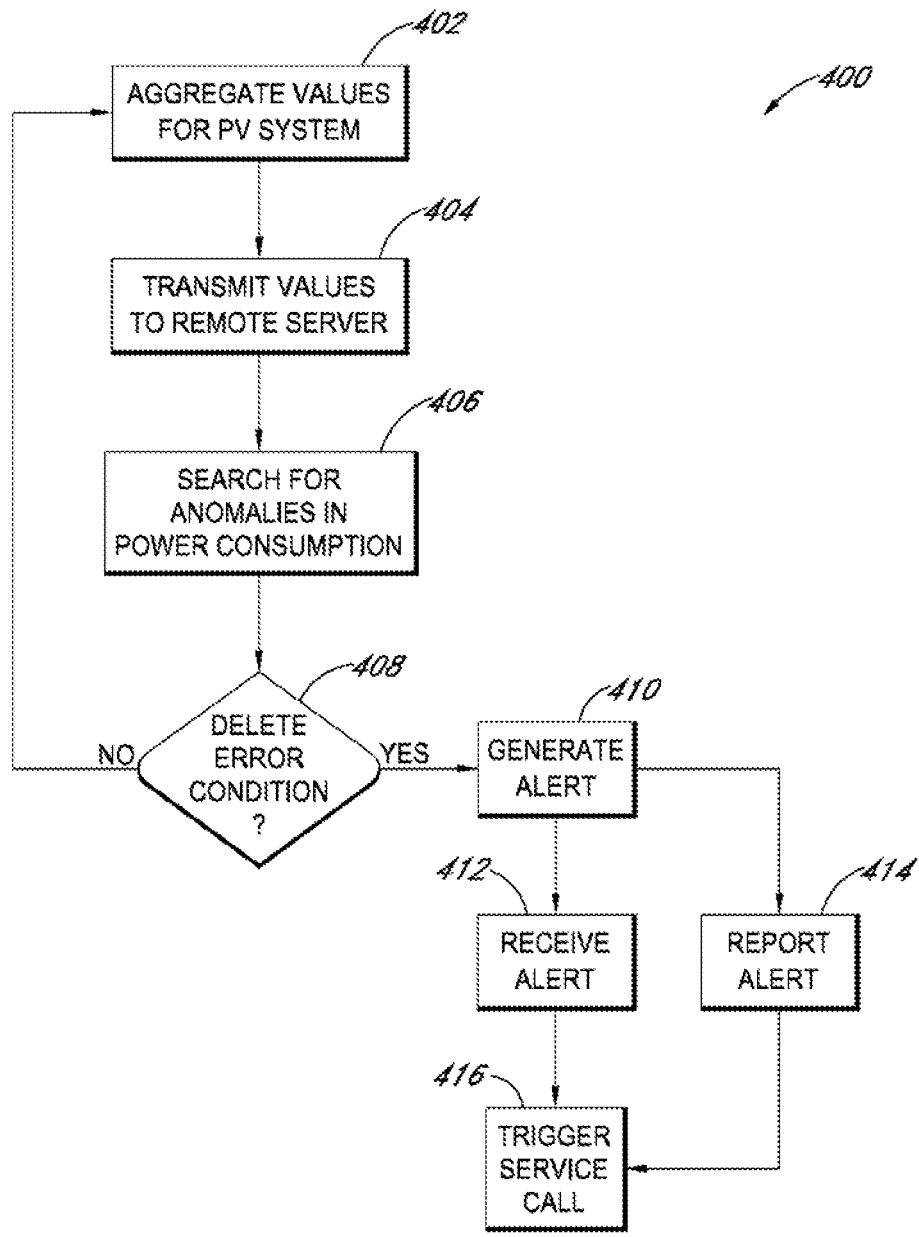
FIG. 4 illustrates a flowchart for remote monitoring of a PV system according to some embodiments.

FIG. 4 depicts a flowchart 400 for remote monitoring of PV system 100 according to some embodiments. Step 402 executes by aggregating values for PV system power and for consumption of the PV system power at gateway 114. In some embodiments, gateway 114 may be associated with an electric meter 122 within service panel 110. Gateway 114 may aggregate the values over a period of time, such as a day, week, month and the like.

Step 404 executes by transmitting the aggregated values for PV power consumption from gateway 114 to a remote server, such as server 118 or 120 shown in FIG. 1. The remote server may include software and algorithms to perform analysis on the aggregated values. For example, the algorithms may compare the aggregated values to historical or predicted values for power consumption for a period of time. The remote server may be associated with a utility or other service.

Step 406 executes by searching for anomalies in the power consumption based on the aggregated values. The software and algorithms may search for the anomalies in the total power consumption. For example, a process may compare the power consumption to historical consumption values to detect an anomaly. Using this example, if a system normally consumes 240 kilowatt-hours during the month of June, then a consumption value of 700 kilowatt-hours may indicate that there is a problem with the system.

Step 408 executes by determining whether an error condition exists based on the analysis. If no, then flowchart 400 may return to step 402. If yes, then step 410 executes by generating an alert. The alert may be a fault signal or other flag produced and reported to a user. The alert may indicate, for example, that PV system 100 needs service. A signal also may be sent to gateway 114, wherein measures may be taken to determine the faulty component or MLPE. Thus, step 412 executes by receiving the alert.

Step 414 executes by reporting the alert to the utility vendor or a third-party. Thus, not only is the user notified, so is the potential owner of PV system 100 that is leasing it to the user. Step 416 executes by triggering a service call for PV system 100 as being in need of maintenance, cleaning, or repair. Thus, actions may be taken at gateway 114 to remote monitor PV system 100 and report an error condition.

Figure 5:
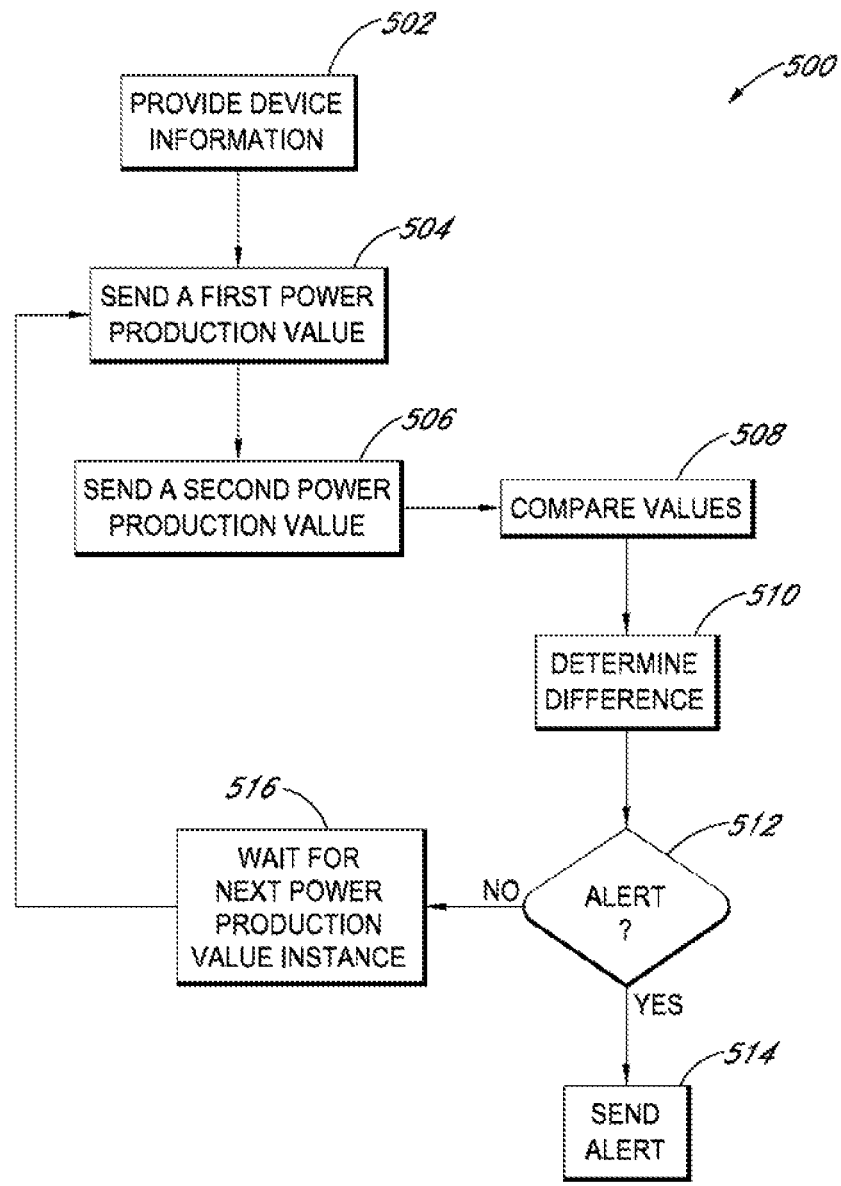
FIG. 5 illustrates a flowchart for performing module-to-module monitoring within a PV system according to some embodiments.

FIG. 5 depicts a flowchart for performing module-to-module monitoring within PV system 100 according to some embodiments. In some PV systems, gateway 114 polls each MLPE device and receives a response. Referring to FIG. 1, gateway 114 may send the polls as message 115a and receive a response as message 115b. Gateway 114 then may aggregate the data and reports it to a service, such as a utility vendor, where it may be stored in server 118 or 120.

Because MLPEs often share the same communication channel, these devices may receive each other's messages. For example, an MLPE device, as PV module 102a shown in FIG. 1, may produce 200 watts while another MLPE device, such as PV module 102b, may produce 27 watts. If PV module 102a "snoops" on the power status message of another MLPE device, then it may compare its own production. Upon detection of a problem, such as the example above with the disparity in power output, a MLPE device may signal gateway 114 that a problem may be occurring. Thus, PV module 102a would send a message 115b to gateway 114. In other embodiments, if the voltage of a nearby module is substantially different than the base MLPE device, then this condition may indicate a different type of abnormality.

In some embodiments, each MLPE device is another machine that may continuously analyze message traffic for information. If the MLPE device is programmed with product information, such as make/model of PV module 102a or 102b, or the expected operating parameters of the PV module (voltage or current ranges), then the MLPE device may compare information from other MLPE devices to its own. The MLPE device then may determine if there is an abnormal condition, possibly due to overheating or other environmental stresses. If the MLPE devices are side-by-side, then the output of both devices should be approximately the same. This process may reduce the time needed to address the abnormality than communicating with gateway 114.

Referring to FIG. 5, step 502 executes by providing device information to a MLPE device, such as PV module 102a, in PV system 100. As noted above, this information may specify information on PV module 102a, or expected operating parameters for the PV module. Step 504 executes by sending a first power production value from the MLPE device. Step 506 executes by sending a second power production value from another MLPE device, such as PV module 102b, in PV system 100. PV modules 102a and 102b may be referred to as peer devices that act as peer components within PV system 100.

Step 508 executes by comparing the first and second power production values. The comparison may occur at PV module 102a, as a first peer MLPE device. Alternatively, the comparison may occur at PV module 102b. In other embodiments, the comparison may occur at another peer component, or MLPE device, within PV system 100 or at gateway 114. The comparison may perform different actions, such as determine a difference between the production values, as shown in step 510. Step 510 may be executed in conjunction with step 508. Other actions performed in the comparison step may include determining an average power production value between the two devices, a sum total of the power production values, and the like.

Step 512 executes by determining whether an alert condition exists based on the comparison. For example, the disclosed embodiments may determine if the difference between the power production values is greater than a specific value. The specific value may relate to the MLPE devices used as peer-to-peer components within PV system 100. If the difference is greater than the specific value, then a problem possibly exists in one of the MLPE devices. Is so, then step 514 executes by sending an alert to gateway 114. Alternatively, the alert may be sent to another MLPE device within PV system 100, or to a utility vendor or user.

If step 512 is no, then step 516 executes by waiting for the next power production value instance. For the "no" condition, the comparison did not identify an alert condition and the MLPE devices appear to be operating as normal. Thus, the disclosed embodiments may wait to perform the disclosed process when the next power production value is produced. Using the example above, PV modules 102a and 102b may produce a power production value about every 5 minutes. If normal operating conditions are determined by the comparison in step 508, then flowchart 500 flows to step 504 at the end of the 5 minute period to produce the next power production value.

The implementation of the embodiments disclosed by FIG. 5 also may be used to establish a pattern of power production values within a MLPE device. The pattern may be used to determine shading instances or periods when the other peer MLPE device or devices are not operating properly. By doing so at a peer-to-peer level, gateway 114 is not overtaxed with comparing production values between different devices and frees it to do other tasks.

Figure 6:
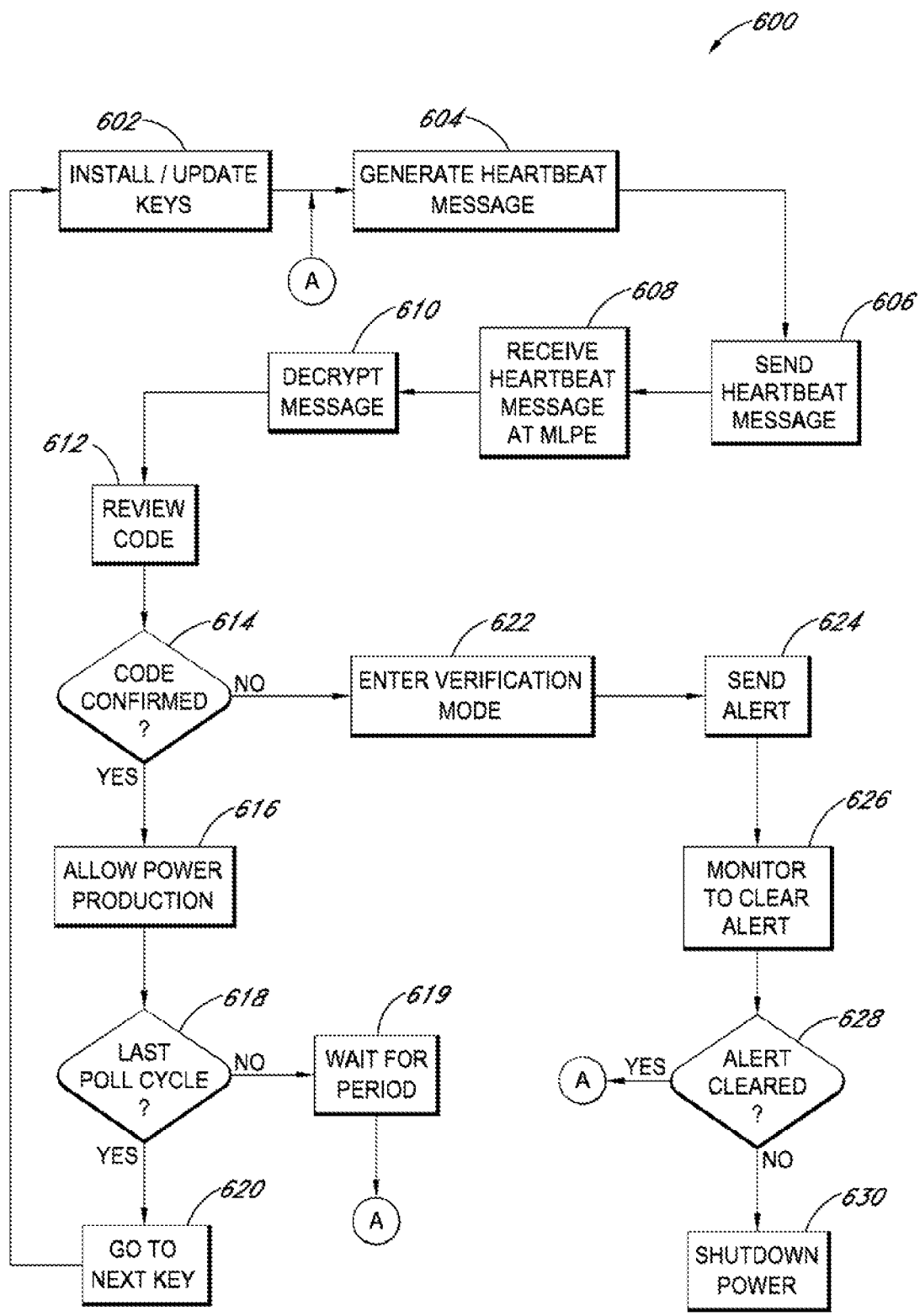
FIG. 6 illustrates a flowchart for the remote enabling or disabling of a PV system according to some embodiments.

FIG. 6 depicts a flowchart for the remote enabling or disabling of PV system 100 according to the disclosed embodiments. The process disclosed by FIG. 6 may be used to enable or disable a system of microinverters in the MLPE devices of PV system 100. Such a process may be desired when a PV system customer has failed to make a lease payment and the vendor may shut down power from the PV system until payments are made in an acceptable time frame.

The disclosed embodiments involve gateway 114 periodically providing the MLPE devices in PV system 100 with a secure signal to keep operating. This secure signal also may be known as a heartbeat signal. In the absence of the signal, the MLPE devices will stop producing power but also perform a process to prevent accidental shutdown of a paying customer. Using the above example, every time a payment is made, a new code may be sent indicating that the PV system is a "go" to operate. Issues regarding the implementation of such a process may include the security of such systems. These issues are important because leased systems, or systems based on power purchase agreements, produce no revenue if the payments are not made. Equipment may be placed in the field that drives costs without recovery. The disclosed embodiments may seek to prevent this problem from occurring.

Step 602 executes by installing or updating the keys used by gateway 114 to perform the remote enable or disable process. In some embodiments, gateway 114 may have encryption of the enable/disable messages using a one-time pad cipher. Preferably, a state machine may establish the proper loading of the one-time pad. Once the pad has been put in place, it may be changed with a new pad. A new pad message will contain a number of keys sufficient to cover a minimum time period, such as the lease payment term.

For example, the pad may contain 32 56-bit digital encryption standard (DES) keys, and a 32-bit pad identifier and a 32-bit previous pad identifier. The pad may be encrypted using 3-DES by the utility vendor prior to being transmitted to gateway 114. The pad also may be decrypted using 3-DES by a receiving MLPE device when it is installed. Gateway 114 may receive the pad as a text-encoded piece of information and then may package it into a PLC message. The MLPE device may verify that the previous pad identifier is correct prior to installing the pad. In some embodiments, factory programming may set this to a pre-defined value associated with the MLPE device's 3-DES keys. Gateway 114 will receive the response message then confirm the response. Once this handshake operation has been completed, the pad with the keys has been installed with the key in index 0 becoming active.

Step 604 executes by generating a heartbeat message by gateway 114. The heartbeat message may act as a secure signal. In some embodiments, the heartbeat message includes the current key encrypted two random 32-bit numbers. The random numbers may be provided by the utility vendor to gateway 114. The random numbers may be known as R1 and R2, and may have the following relationship when they are randomly selected: R1now>R1prev and R2now<R2prev.

Step 606 executes by sending the heartbeat message from gateway 114 to the MLPE devices within PV system 100. For example, referring to FIG. 1, gateway 114 may send the heartbeat message, as message 115a, to MLPE devices within sets 102 and 104. Step 608 executes by receiving the heartbeat messages at the MLPE devices.

Step 610 executes by decrypting the heartbeat message at each MLPE device. Preferably, the MLPE device, such as power module 102a, is able to determine the correct code having the key from the heartbeat message. Step 612 executes by reviewing the code in the heartbeat message by the MLPE device. Step 614 executes by determining whether the correct code is confirmed. The outcome of this determination, whether correct or incorrect, may be sent as a response message 115b to gateway 114. By doing this, the MLPE device verifies the relationship with PV system 100.

If step 614 is yes, then step 616 executes by allowing power production from the MLPE device to PV system 100. The MLPE device also may note the numbers received in the heartbeat message for future use. In some embodiments, a response message 115b may be sent to gateway 114, which may report the response to the utility vendor.

Step 618 executes by determining whether the poll cycle for the heartbeat message is the last poll cycle. As noted above, the keys may last for a certain period of time. For example, each key may be valid for 128 poll cycles, wherein a poll cycle may refer to the process of generating and sending the heartbeat message. Once a key has been used for 128 cycles, then a new key may be assigned. Thus, if step 618 is no, then step 619 executes by having gateway 114 and the MLPE devices wait for a period of time while returning flowchart 600 to step 604 to generate another heartbeat message using the current key. In some embodiments, this period of time may be about 10 to 20 minutes. In other embodiments, this period of time may be 15 minutes.

If step 618 is yes, then step 620 executes by going to the next key. Thus, flowchart 600 may return to step 602 to update the key. Step 602 may be executed in a different manner than disclosed above when moving to the next key. Here, a "go to the next key" command may be sent to the MLPE device to facilitate this action. In some embodiments, if the "go to the next key" command is not received, then the MLPE device may enter a verification mode, disclosed below. The request to "go to the next key" may be issued by the utility vendor. This command may require a confirmation of the response. Such a response from the MLPE device may be the pad identifier, rotated by twice the value of the new index, and encrypted using the MLPE device's 3-DES key. The utility vendor may receive this message, decrypt it with 3-DES, and verify that the MLPE device is on the correct key in the pad. An improper response indicates that something is wrong. A good response may result in the utility vendor sending an acknowledgement that the key was handled correctly.

Referring back to step 614, if the determination is the code is not confirmed, then step 622 executes by entering a verification mode at the MLPE device. Step 624 executes sending an alert to gateway 114. The alert may be cleared while the MLPE device is in the verification mode. Thus, step 626 executes by monitoring the message traffic from gateway 114 to determine if the alert has been cleared. The MLPE device then may "check-in" for a specified number of times, with each check-in occurring at intervals. For example, the MLPE device may check-in about 120-140 times with the interval between check-ins at about 10-20 minutes. More specifically, the MLPE device may check-in about 128 times at intervals of about 15 minutes.

A verification mode alert may be cleared by receiving an appropriate message at the MLPE device. For example, an alert may be cleared by receiving a "refresh," a "go to the next key," or a "have some new keys" message. If the keypad is exhausted or new keys are needed during the update step disclosed above, then the MLPE device may respond with a "down for the count" alert and may continue into a set of poll cycles. This mode may be exited with a valid "have some new keys" message.

Step 628 executes by determining whether the alert has been cleared within the allotted number of check-ins. If step 628 is yes, then flowchart 600 may return to step 604. Alternatively, flowchart 600 may return to another step disclosed above. If step 628 is no, then step 628 executes by shutting down the power from the MLPE device. For example, the MLPE device may enter a "dead" mode that may be exited with a valid "have some new keys" message. Further, the disclosed embodiments may utilize a shutdown command that places the MLPE device into a "dead" mode with no check-ins. A shutdown command may be used in those instances where the utility vendor needs to shutdown the generation of power without using the verification mode.

The verification mode allows for the utility vendor to address possible delinquent customers without shutting off power to paying customers. Further, the verification mode may prevent attacks by hackers or nonpaying customers to "fool" the MLPE device into continuing to produce power. The "refresh" message is part crypto, part pitfall trap. There is a known relationship between the R1 and R2 values. The utility vendor should send a message with the correct relationship. An attacker who decides to just send messages will eventually run out of room if the messages are randomly successful. Each successful spoof reduces the odds of the next message being successful because there are fewer and fewer valid random values remaining. The message also may prevent replay attacks because R1now is greater than R1prev, and R2now is less than R2prev.

The embodiments disclosed by FIG. 6 also may be used for an MLPE device startup sequence. The MLPE device "wakes up" in verification mode and sends the corresponding alert. This action consumes a check-in. The alert is sent to the utility vendor, which then sends a "go to the next key"

message. The MLPE device and the utility vendor may know when the end of the pad of keys has been reached, in which case a new pad of keys may be sent.

A countdown timer may be set for each "refresh" message that is successful. In some embodiments, this timer may be about 10-30 minutes, or, more specifically, about 20 minutes. If the timer expires, then a check-in is consumed and the timer may be set for another time period. In some embodiments, the other time period may be less than the initial one. On days with many restarts, the utility vendor may vary the stride for each check-in.

The disclosed embodiments also may have a "brick" mode that permanently shutdowns the MLPE device. The brick mode may be used if a suitable number of leases expire without refresh. A specific encrypted sequence may be required to bring the MLPE device back on-line. For example, the MLPE device may be sent a message that includes the encrypted previous pad identifier. If the appropriate message with the encrypted information is not received, then the MLPE device remains shutdown.

Figure 7:
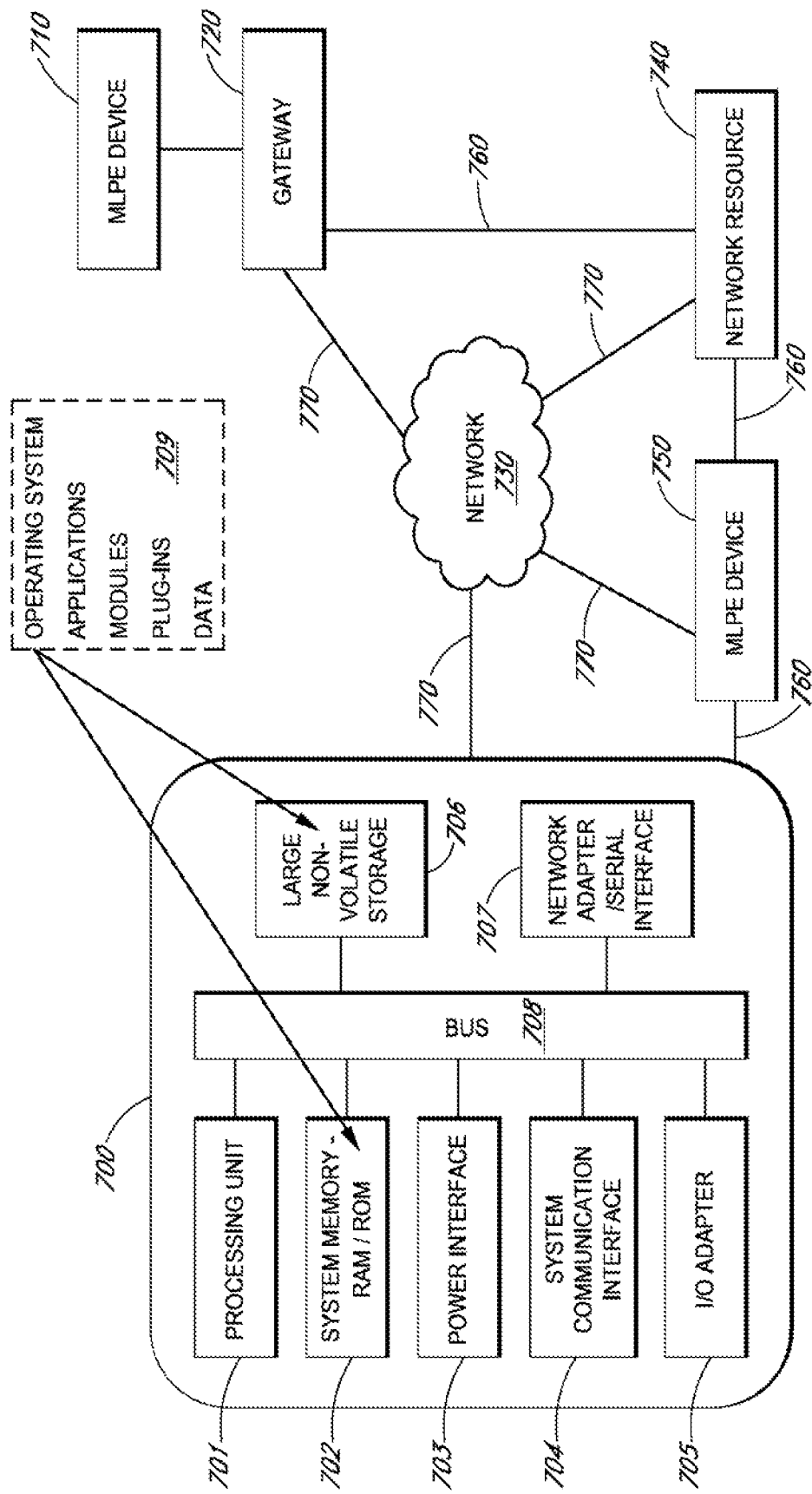
FIG. 7 illustrates management components and MLPE devices as may be employed by a PV system according to some embodiments.

FIG. 7 illustrates a schematic of gateway arrangements, MLPE devices, and network resources as may be employed in embodiments. FIG. 7 shows a gateway arrangement 700 as a single device that includes a CPU 701, a main memory 702 connected to a bus 708. Other gateway arrangements may be comprised of several devices. The CPU 701 may employ various architectures and is preferably based on 32 bit or 64 bit architecture. FIG. 7 also shows the gateway employing software 709 for loading or storage on the memory 702 and the non-volatile large storage 706. This storage 706 may also be connected to the bus 708 like the power interface 703, the system communication interface 704, the I/O adapter 705, and the network adapter 707. Network 730 is shown to be reachable by the gateway 700 as well as having communication pathways to the MLPE device 750, the network resource 740, and the gateway 720. MLPE device 710 is shown with a direct arrangement to the gateway 720 and without a direct communication link to the network 730. Direct communication links are also shown between the gateway 720 and the network resource 740 and the MLPE device 750 and the gateway 700. Communication pathways to and from the network are indicated by lines 770 while communication pathways without using the network are shown with lines 760.

As shown in the gateway 700, a display or other user interface may be connected to the bus 708 via the I/O adapter 705. Such a display may be used for management of the gateway, for reaching information on the gateway, for reaching information available to the gateway and for other reasons as well. The storage 706 may be a hard disk or solid state drive. The I/O adapter may also accommodate keyboards, mice, or other user interface peripherals.

An operating system, applications providing a processing environment, modules for performing embodiments taught herein, and plug-ins for making adjustments to any of the foregoing may all be stored along with data, on the storage 706 and the memory 702 for use by the processor 701. This software may configure the processor for performing aspects of the invention. The processor may also be an ASIC specifically configured without the need to load software during a boot cycle in order to perform aspects of embodiments.

The network adapter 707 may employ the Ethernet® protocol as well as other communication protocols and may serve to physically connect the gateway to a communication line and therein provide network 770 access or a link to an MLPE device, for example.

The power interface 703 may be arranged with outputs of a PV module or PV cells. The gateway may use this interface for monitoring purposes as well as for its own power supply.

The MLPE devices 710 and 750 may each employ some or all of the components of the gateway 700 with these components being configured and tailored to perform the specific functions of the MLPE devices. In operation, the MLPE devices and the gateways may communicate directly with each other as well as through the network 730. These communications may include exchange of data in order to carry out the processes and functions of embodiments. Either or both of the MLPE devices and the gateway may also be connected to network resources either directly or through the network 730. These network resources may provide additional services such as weather information, both historical and current conditions, power grid status and operational activity, historical and present conditions for other gateways or MLPE devices, and other functionality consistent with the embodiments provided and described herein. Thus, the network resources 740 can provide additional sources of information for the MLPE devices and the gateways to assist them during operation and for management and improvement purposes.

Figure 8:
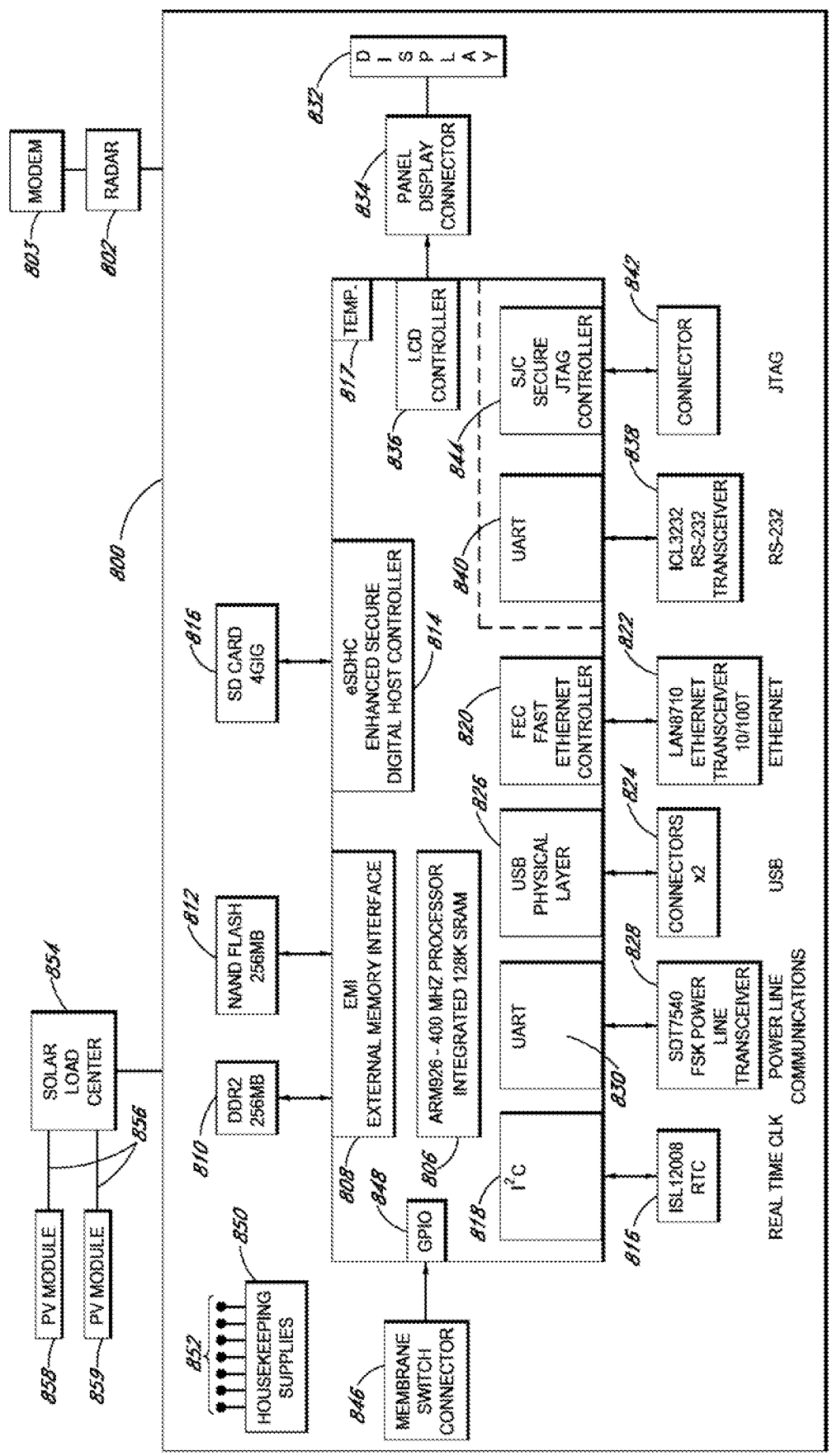
FIG. 8 illustrates a block diagram of a gateway according to some embodiments.

FIG. 8 depicts a block diagram of gateway 800 according to some embodiments. Gateway 800 may relate to gateways 114, 700 and 720 disclosed above. The arrangement shown in FIG. 8 is an example arrangement of a gateway and its relation in a PV system. Other embodiments may implement different arrangements while providing the functionalities disclosed herein.

Gateway 800 may serve as the communications hub of a PV solar array. As noted with the other gateways disclosed herein, gateway 800 continuously monitors the performance of the MLPE devices in a PV system, such as PV system 100. Communications between gateway 800 and associated MLPE devices may take place over AC wiring. Thus, no additional data cabling should be needed, though data cabling may be used in conjunction with gateway 800.

Gateway 800 may serve as the internet gateway for a PV system. Gateway 800 also may implement different power options, such as using a standard wall outlet, a 12 volt DC source or directly into the service panel for the PV system. Referring back to FIG. 1, the gateway may be plugged into service panel 110. Gateway 800 may be an outdoor-rated enclosure that includes external protection against the elements, such as falling rain, sleet, snow and ice formation. Gateway 800 also includes indoor protection against dripping water.

Gateway 800 may use at least two different protocols to communicate. One protocol may be a known internet protocol for communications between gateway 800 and the web portal. Gateway 800 may communicate over a network by connecting to a router 802, which is connected to a modem 804. Another protocol may be a power line communications (PLC) protocol for communicating between gateway 800 and the microinverters within the MLPE devices.

Gateway 800 may include the following components that act as a single board computer to provide the functionality disclosed above. Gateway 800 includes a processor 806. Preferably, processor 806 is a 32 bit, 400 MHz advanced reduced instruction set computing (RISC) machine (ARM) processor, but it is not limited to these specifications. Alternatively, processor 806 may be a complex instruction set computing (CISC) processor. Processor 806 is capable of supporting a full operating system, such as LINUX™ or WINDOWS™.

Gateway 800 also includes an external memory interface 808 that helps processor 806 retrieve data, such as instructions or stored data, from dynamic RAM 810 and flash memory 812. Dynamic RAM 810 preferably is a double data rate (DDR) dynamic RAM, and may have a memory size greater than 128 MB. Flash memory 812 may be greater than 128 MB as well, and, preferably, is a NAND type flash memory. Gateway 800 also may include an enhanced secure digital host controller 814 to read secure digital (SD) memory card 816. Preferably, SD memory card 816 has a capacity greater than 2 GB.

Gateway 800 includes a real time clock 816 coupled to inter-integrated circuit 818. Inter-integrated circuit 818 may act as a single-ended, serial computer bus to attach peripherals to processor 806. Real time clock 816 may have a super cap backup with about a week or more duration. Gateway 800 also includes a temperature sensor 817. Preferably, gateway 800 has a nominal power consumption of less than 2 watts, or even less than 1 watt.

Gateway 800 also includes several user interfaces. For example, fast Ethernet controller 820 may receive Ethernet transceiver 822. Preferably, Ethernet transceiver 822 is a 10/100baseT Ethernet port. Gateway 800 may include at least two universal serial bus (USB) ports 824. One port may be a boot port, while another port may be a customer accessible port. USB ports 824 connect to USB physical layer 826.

PLC communications may occur through power line transceiver 828. PLC communication may be accessible through the power cord. Power line transceiver 828 may be coupled to universal asynchronous receiver/transmitter 830. Gateway 800 may implement a ½ duplex, synchronous communication mode for PLC communications. Power line transceiver 828 may implement a frequency shift key (FSK) modulation with a carrier of 110 KHz.

Gateway 800 also includes a display 832. Display 832, in some embodiments, may be a 4 line by 20 character liquid crystal display (LCD) device. Display 832 may connect to the logic of gateway 800 using panel display connector 834 and LCD controller 836. Processor 806 may instruct the data or other information be displayed in response to commands.

RS-232 transceiver 838 may be used for serial communication transmission of data to and from gateway 800. RS-232 transceiver 838 may connect to serial port 840, which may be a universal asynchronous receiver/transmitter port. Gateway 800 also includes a joint test action group (JTAG) connector 842 coupled to a secure JTAG controller 844. The JTAG configuration may be used as a debug port implementing a serial communications interface.

Membrane switch connector 846 is coupled to gateway 800 via a general-purpose input/output (GPIO) pin 848. These components may serve as an additional digital control line for gateway 800.

Housekeeping power supply 850 may provide power for the various components within gateway 800. Housekeeping power supply 850 includes circuitry to convert input power from either an AC voltage or a DC voltage into values appropriate for the items disclosed above. The housekeeping output voltages may be supplied to the components via housekeeping supply rails 852. Each rail may provide a different voltage depending on the specifications for the components.

For example, one housekeeping supply rail 852 may provide a 12 volt switched voltage for PLC communications components. Another housekeeping supply rail 852 may provide 5 volts for the USB connectors 824. A housekeeping supply rail 852 may provide 3.3 volts for processor 806, and the flash, Ethernet and SD components. A housekeeping supply rail 852 also may provide 1.8 volts for the DDR components. Other voltages may include 1.5 volts, 1.45 volts and −1.3 volts, and any other voltages needed to operate gateway 800.

Gateway 800 may be connected to a PV system having PV modules. Gateway 800 may communicate through a network, such as an internet connection, using router 802. IP data is sent from gateway 800 to router 802. Router 802 may transmit the IP data over the network using a modem 803. In other embodiments, the router and modem may be embedded within gateway 800 so that the gateway may communicate directly over the network.

Gateway 800 also may be connected to a solar load center 854. Solar load center 854, in turn, may be connected with a plurality of PV modules, shown as PV modules 858 and 859. Any number of PV modules may be connected to solar load center 854. Communications from gateway 800 to the PV modules may occur over PLC communication lines 856. As disclosed above, the disclosed embodiments may implement a PLC communications protocol to facilitate these communications.

Figure 9:
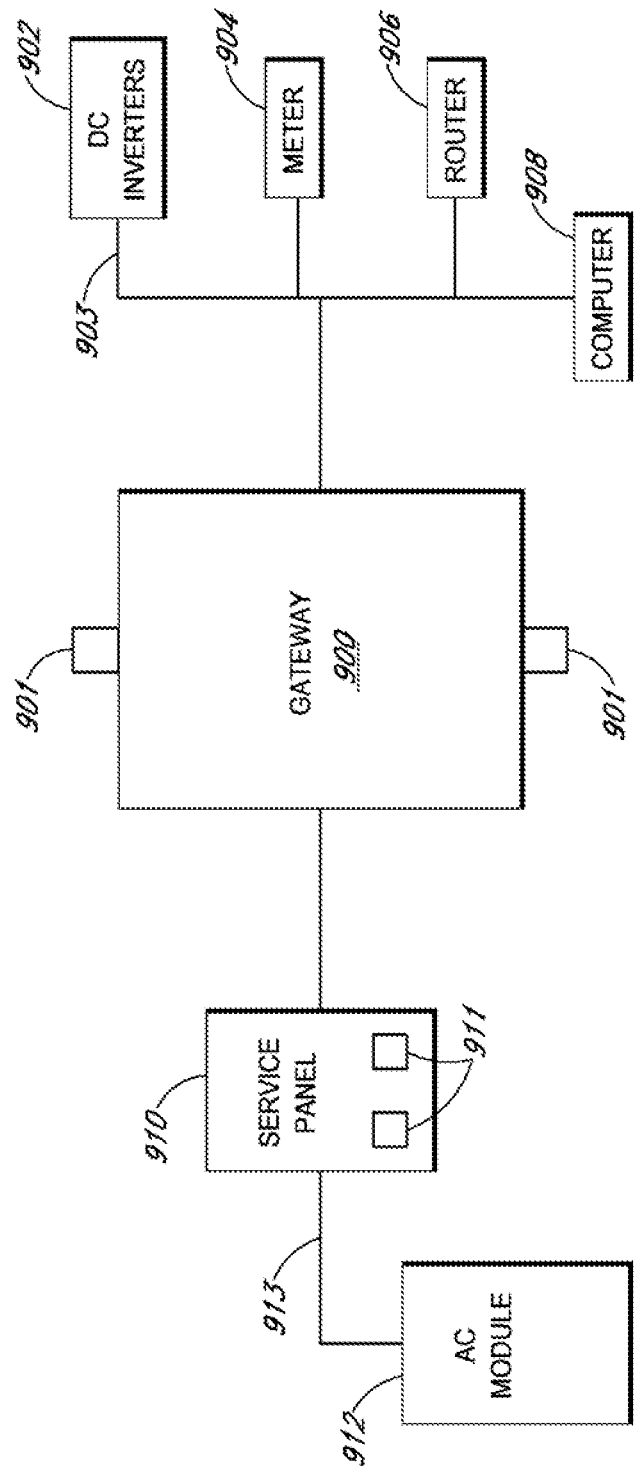
FIG. 9 illustrates a configuration of a gateway associated with a PV system according to some embodiments.

FIG. 9 depicts a configuration of a gateway 900 connected to a PV system according to some embodiments. Gateway 900 may correspond to gateways 800, 700, 720 or 114 disclosed above. Gateway 900 may be mounted with a bracket 901.

Gateway 900 may be connected to service panel 910. Service panel 910 may house consumption current transformers 911. Service panel 910 may be connected to AC module 912 with AC module connection 913. Thus, AC voltage may be supplied to gateway 900 via service panel 910 as current transformers 911 are connected with wires to connectors in the gateway. Current transformers 911 provide consumption monitoring.

Gateway 900 also may be connected to PV modules within a PV system, shown as inverters 902 in FIG. 9. Cables 903 may correspond to the type of inverter used. These connections allow gateway to communicate to the inverters and to collect data on the inverters and to provide the functions disclosed above.

Gateway 900 also may be connected to meter 904. Router 906 also is connected to gateway 900. Preferably, an Ethernet cable is connected between the gateway and the router. Computer 908 may be connected to gateway 900 to provide help during installation and to troubleshoot problems. Computer 908 may run an application to setup communication, check firmware, discover devices within the PV system, verify device operation and commission the site of gateway 900.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A method of managing a photovoltaic system with photovoltaic module-level power electronics (MLPE), the method comprising:
one of installing or updating a digital encryption standard (DES) key used by a gateway to one of enable or disable power production at one or more MLPE devices;
generating a message including the DES key and transmitting the message from the gateway to the one or more MLPE devices;
receiving a response to the message at the gateway from the one or more MLPE devices; and
one of enabling or disabling power production at the one or more MLPE devices based on the response to the message.

2. The method of claim 1, further comprising encrypting the message using a one-time pad cipher received at the gateway from a utility vendor.

3. The method of claim 2, further comprising packaging the one-time pad cipher into a power line communication (PLC) message.

4. The method of claim 2, wherein the one-time pad cipher comprises 32 56-bit DES keys, a 32-bit one-time pad cipher identifier, and a 32-bit previous one-time pad cipher identifier.

5. The method of claim 4, wherein each of the 32-bit one-time pad cipher identifier and the 32-bit previous one-time pad cipher identifier are two random 32-bit numbers R1 and R2, respectively, and wherein R1 now >R1 previous and R2 now <R2 previous.

6. The method of claim 4, further comprising decrypting the message at the one or more MLPE devices using 3-DES keys.

7. The method of claim 1, further comprising determining whether a poll cycle for the message is a last poll cycle, wherein the poll cycle comprises generating the message including the DES key and receiving the response to the message.

8. The method of claim 7, wherein the DES key is valid for one hundred and twenty-eight (128) poll cycles, and further comprising updating the DES key to a new DES key after the 128 poll cycles.

9. The method of claim 1, wherein the one of the enabling or disabling power production at the one or more MLPE devices is based on the message including a determination that the DES key is correct or incorrect, respectively.

10. The method of claim 9, wherein prior to disabling power production at the one or more MLPE devices if the DES key is incorrect, sending an alert to the gateway from the one or more MLPE devices, determining whether the alert is cleared by the one or more MLPE devices, and if the alert is cleared by the one or more MLPE devices, generating a new message including the DES key and transmitting the new message from the gateway to the one or more MLPE devices.

11. A photovoltaic (PV) system with photovoltaic module-level power electronics (MLPE), comprising:
one or more MLPE devices; and
a gateway communicatively connected to the one or more MLPE devices and programmed to one of install or update a digital encryption standard (DES) key to one of enable or disable power production at one or more MLPE devices, generate a message including the DES key and transmit the message to the one or more MLPE devices, receive a response to the message from the one or more MLPE devices, and one of enable or disable power production at the one or more MLPE devices based on the response to the message.

12. The PV system of claim 11, wherein the gateway is communicatively connected to a utility vendor and programmed to encrypt the message using a one-time pad cipher received from the utility vendor.

13. The PV system of claim 12, wherein the gateway is further programmed to package the one-time pad cipher into a power line communication (PLC) message.

14. The PV system of claim 12, wherein the one-time pad cipher comprises 32 56-bit DES keys, a 32-bit one-time pad cipher identifier, and a 32-bit previous one-time pad cipher identifier.

15. The PV system of claim 14, wherein each of the 32-bit one-time pad cipher identifier and the 32-bit previous one-time pad cipher identifier are two random 32-bit numbers R1 and R2, respectively, and wherein R1 now >R1 previous and R2 now <R2 previous.

16. The PV system of claim 14, wherein the one or more MLPE devices are programmed to decrypt the message using 3-DES keys.

17. The PV system of claim 11, wherein the gateway is further programmed to determine whether a poll cycle for the message is a last poll cycle, and wherein the poll cycle comprises generating the message including the DES keys and receiving the response to the message.

18. The PV system of claim 17, wherein the DES key is valid for one hundred and twenty-eight (128) poll cycles, and wherein the gateway is further programmed to update the DES key to a new DES key after the 128 poll cycles.

19. The PV system of claim 11, wherein the gateway is further programmed to one of enable or disable power production at the one or more MLPE devices based on the message including a determination that the DES key is correct or incorrect, respectively.

20. The PV system of claim 19, wherein prior to the gateway disabling power production at the one or more MLPE devices if the DES key is incorrect, the gateway is further programmed to receive an alert from the one or more MLPE devices, determine whether the alert is cleared by the one or more MLPE devices, and if the alert is cleared by the one or more MLPE devices, generate a new message including the DES key and transmitting the new message to the one or more MLPE devices.

* * * * *